(12) United States Patent  (10) Patent No.: US 8,796,150 B2
Akinmade-Yusuff et al.  (45) Date of Patent: Aug. 5, 2014

(54) BILAYER TRENCH FIRST HARDMASK STRUCTURE AND PROCESS FOR REDUCED DEFECTIVITY

(75) Inventors: Hakeem B. S. Akinmade-Yusuff, Beacon, NY (US); Samuel Sung Shik Choi, Beacon, NY (US); Edward R. Engbrecht, Poughkeepsie, NY (US); John A. Fitzsimmons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 13/012,166

(22) Filed: Jan. 24, 2011

(65) Prior Publication Data

US 2012/0187546 A1  Jul. 26, 2012

(51) Int. Cl.
*H01L 21/311* (2006.01)
*H01L 21/32* (2006.01)
*H01L 29/06* (2006.01)

(52) U.S. Cl.
USPC ............ 438/702; 257/622; 438/703; 438/736

(58) Field of Classification Search
CPC .................. H01L 21/31144; H01L 21/76804; H01L 21/76807
USPC .................................. 438/702, 703, 717, 736
See application file for complete search history.

(56) References Cited

U.S. PATENT DOCUMENTS

| | | | |
|---|---|---|---|
| 5,686,354 A | 11/1997 | Avanzino et al. | |
| 6,184,138 B1 | 2/2001 | Ho et al. | |
| 6,252,290 B1 | 6/2001 | Quek et al. | |
| 6,853,043 B2 | 2/2005 | Yeh et al. | |
| 6,995,085 B2 | 2/2006 | Lui et al. | |
| 7,071,054 B2 | 7/2006 | Park | |
| 7,078,350 B2 | 7/2006 | Kim et al. | |
| 7,211,519 B2 | 5/2007 | Takigawa et al. | |
| 7,226,853 B2 | 6/2007 | Bekiaris et al. | |
| 7,247,555 B2 | 7/2007 | Cong et al. | |
| 7,291,553 B2 | 11/2007 | Chen et al. | |
| 7,326,651 B2 | 2/2008 | Baks et al. | |
| 7,378,738 B2 | 5/2008 | Brunner et al. | |
| 7,393,777 B2 | 7/2008 | Cooney, III et al. | |
| 7,485,566 B2 | 2/2009 | Kawahara et al. | |
| 7,598,168 B2 | 10/2009 | Han et al. | |
| 7,655,547 B2 | 2/2010 | Cooney, III et al. | |
| 7,704,870 B2 | 4/2010 | Ma et al. | |
| 2003/0119307 A1* | 6/2003 | Bekiaris et al. | 438/638 |
| 2004/0038521 A1 | 2/2004 | Kim et al. | |
| 2004/0137711 A1 | 7/2004 | Deguchi | |
| 2005/0079701 A1* | 4/2005 | Baks et al. | 438/622 |
| 2005/0191822 A1 | 9/2005 | Liu | |
| 2006/0003576 A1 | 1/2006 | Yeh et al. | |
| 2006/0264033 A1* | 11/2006 | Olmen et al. | 438/637 |
| 2008/0171433 A1 | 7/2008 | Huang et al. | |
| 2008/0200026 A1 | 8/2008 | Koh et al. | |
| 2009/0200683 A1 | 8/2009 | Colburn et al. | |
| 2010/0216310 A1* | 8/2010 | Metz et al. | 438/694 |

* cited by examiner

*Primary Examiner* — Ha Tran T Nguyen
*Assistant Examiner* — Raj R Gupta
(74) *Attorney, Agent, or Firm* — Scully, Scott, Murphy & Presser, P.C.; Catherine Ivers

(57) ABSTRACT

A method and structure for transferring a lithographic pattern into a substrate includes forming a dielectric hardmask layer over a dielectric substrate. A metal hardmask layer is formed over the dielectric hardmask layer. A protective capping hardmask layer or capping film is formed over the metal hardmask layer, and a lithographic structure for pattern transfer is formed over the capping layer. A pattern is transferred into the dielectric substrate using the defined lithographic structure. The capping hardmask layer can be removed during subsequent processing.

11 Claims, 2 Drawing Sheets

BILAYER TRENCH FIRST HARDMASK STRUCTURE AND PROCESS FOR REDUCED DEFECTIVITY

BACKGROUND

The present disclosure relates to a semiconductor structure and method for semiconductor fabrication. More specifically the present disclosure relates to, a semiconductor structure and method of semiconductor fabrication for improving lithographic patterning and the transfer of a lithographic pattern into a substrate.

In semiconductor manufacturing, Back End of the Line (BEOL) copper interconnect scaling uses a Trench First Metal Hard Mask (TFMHM) process to maintain pattern fidelity and control during the manufacturing process, for example, from lithography to plasma etch. One motivation known in the art for selecting the Trench First Hard Mask (TFHM) is to eliminate a pass of oxygen type plasma ash that leads to low-k dielectric damage found both in line (trench) sidewalls as well as in vias. A low-κ dielectric material has a lower dielectric constant than silicon dioxide. During processing, a metal hard mask may include a titanium nitride (TiN) film deposited on top of a dielectric hard mask film. Lithographic patterns may be formed on top of the TiN film using organic-containing films. However, undesirable consequences to the trenches of an interconnect structure can occur during the above processing. Thus, TFHM integration results in new challenges with respect to a metal hard mask (e.g., TiN) film's erosion and interaction to plasma during both lithographic rework and dual damascene etching. For example, during a typical rework process, plasma chemistries can both modify the surface and reduce the TiN film thickness which subsequently leads to a wider critical dimension (CD) during a dual damascene etch process step during interconnect processing. Consequently, this results in an undesirable increase in the non-uniformity across a wafer diameter. Moreover, long process queue times between TiN deposition and lithography may occur, and thus, the metallic TiN film forms undesirable native oxides that affect lithography and react with fluorocarbon plasma in such a manner that the control of critical dimension uniformity (CD) of features across the wafer becomes more difficult. Additionally, these mechanisms can create physical defects which affect the overall pattern fidelity.

It is a known difficulty of metal Hardmask process integration techniques, that a metal hardmask such as TiN (Titianium Nitride) sputters during dielectric etch steps of an RIE process. Typical chemistries used during a dielectric etch step of a typical metal Hardmask RIE integration process include: $CF_4$, $CHF_3$, $CH_2F_2$, $C4F_8$ with additions of $CO_2$, CO, $N_2$, $H_2$, Ar. These gases physically impact the metal hardmask and both sputter metal into the active patterning space, which potentially results in defects related to a micro-masking of the dielectric by the re-sputtered hardmask material, as well as erode the final physical profile during the RIE profiling process. The problems above result in a RIE process that is difficult to control, and possibly unable to meet the required parameters of the pattern transfer process. For example, the result of the TiN erosion that occurs is a widening of a top trench CD resulting in electrical shorts and reliability degradation.

In semiconductor manufacturing, lithography and plasma etch define the pitch and pattern fidelity of a trench profile. The etch may use polymerizing chemistry to shrink the CD to avoid unwanted CD enlargement. However, a problem with this approach is that the phenomenon of etch bias leads to RIE lag between nested and wide trench lines for both CD and depth. The above occurs because polymerization and etch rate are typically feature size dependent. Variations in pattern transfer can be affected by many parameters, including sidewalls, feature size, pattern density, free mean path, etch chemistries and RIE process parameters, that lead to different polymer deposition thickness as a function of line width. It would therefore be desirable to discourage or reduce uncontrolled surface modification, such as erosion and interaction with plasma, of a metal hardmask, such as a TiN hardmask.

SUMMARY

In an aspect of the present disclosure, a method for forming a lithographic pattern on a substrate includes: forming a dielectric hardmask layer over a dielectric substrate; forming a metal hardmask layer over the dielectric hardmask layer; forming a capping hardmask layer over the metal hardmask layer; forming at least one organic-containing layer over the capping layer; forming a pattern through the at least one organic layer into the dielectric substrate; and removing the organic layer. In a related aspect, the capping hardmask layer may be removed.

BRIEF DESCRIPTION OF THE DRAWINGS

The features and advantages of the present disclosure will become apparent from the following detailed description of illustrative embodiments thereof, which is to be read in connection with the accompanying drawings. The various features of the drawings are not to scale as the illustrations are for clarity in facilitating one skilled in the art in understanding the disclosure in conjunction with the detailed description. In the drawings.

DETAILED DESCRIPTION

Figure 1:
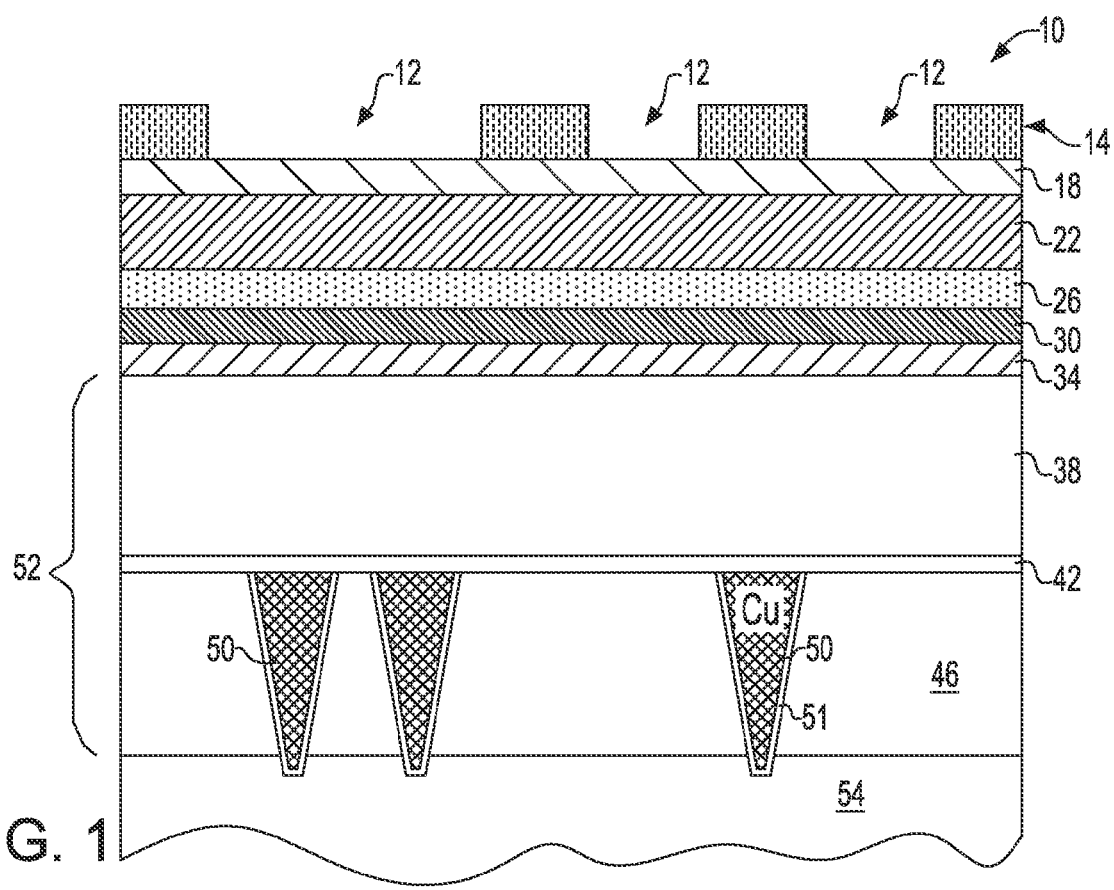
FIG. 1 is a cross sectional side elevational view depicting a structure having a plurality of coating layers.

Referring to FIG. 1, a Back End of the Line (BEOL) film stack on a structure 10 is shown including a plurality of films 14-34, and 42, and a dielectric substrate 52, which are also referred to as layers or coatings. In the embodiment shown in FIG. 1, a photoresist film 14 (or resist), an anti reflective film, such as Silicon-ARC (anti reflective coating) 18, and an organic planarization layer (OPL) 22, are organic-containing material films required for initial pattern definition. Features such as trenches 12 are formed through the resist film 14. Films 30 and 34 are hardmasks, e.g., metal, and/or a dielectric combination. In the embodiment shown in FIG. 1, a metal hardmask may be a titanium nitride (TiN) film 30 deposited over a dielectric hardmask film 34. The dielectric substrate 52 is divided by a capping layer or film 42 into a dielectric substrate layer 46 and an active dielectric layer 38. Dielectric substrate layer 46 may include metal interconnects or a conductive feature, such as conductive lines 50 which may be comprised of copper (Cu) and extend through the dielectric substrate 52. The dielectric substrate 52 may be positioned over a semiconductor substrate 54. The layer or film 42 may be nitrogen-doped silicon carbide or Si—N—C—H. On top of the TiN film, lithographic patterns are formed with the organic films, i.e., resist 14, Si-Arc 18, and OPL 22.

The initial structure 10 may be made utilizing conventional techniques well known to those skilled in the art. For example, an initial interconnect structure can be formed by first applying a dielectric material, e.g., dielectric substrate 52 shown in FIG. 1, to a surface of a substrate 54. The substrate 54 may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The dielectric substrate 52 including dielectric layers 46 and 38, may comprise any interlevel or intralevel dielectric including inorganic dielectrics or organic dielectrics. The dielectric material may be porous or non-porous, with porous dielectrics having a dielectric constant of about 2.8 or less being highly preferred in some embodiments of the present disclosure. Some examples of suitable dielectrics that can be used as the dielectric substrate 52 include, but are not limited to: $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric substrate 52 typically has a dielectric constant that is about 4.0 or less, with a dielectric constant of about 2.8 or less being even more typical. These dielectrics generally have a lower parasitic crosstalk compared with dielectric materials that have a higher dielectric constant than 4.0. The thickness of the dielectric substrate may vary depending upon the dielectric material used as well as the exact number of dielectrics within an interconnect level.

The dielectric substrate layer 46 also includes the conductive feature 50, which is embedded in (i.e., located within) the dielectric substrate layer 46. The conductive feature 50 comprises a conductive material that is separated from the active dielectric layer 38 by a barrier layer, such as layer 51. The conductive feature 50 is formed by lithography (i.e., applying a photoresist to the surface of the dielectric material, exposing the photoresist to a desired pattern of radiation, and developing the exposed resist utilizing a conventional resist developer), and etching (dry etching or wet etching) an opening in the dielectric material. The etched region may be filled with the barrier layer 51, and then with a conductive material forming the conductive feature 50. The barrier layer 51 may comprise Ta, TaN, Ti, TiN, Ru, RuN, W, WN or any other material that can serve as a barrier to prevent conductive material from diffusing therethrough. The barrier layer 51 can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the barrier layer 51 may vary depending on the exact means of the deposition process, as well as the material employed. Typically, the barrier layer 51 has a thickness from about 2 to about 40 nm, with a thickness from about 4 to about 20 nm being more typical.

Following barrier layer 51 formation, the remaining region of an opening within the dielectric substrate layer 46 which will become conductive feature 50, is filled with a conductive material forming the conductive feature 50. The conductive material used in forming the conductive feature 50 includes, for example, polySi, a conductive metal, an alloy comprising at least one conductive metal, a conductive metal silicide or combinations thereof. Preferably, the conductive material that is used in forming the conductive feature 50 is a conductive metal such as Cu, W or Al, with Cu or a Cu alloy (such as AlCu) being preferred in some embodiments. The conductive material is filled into the openings in the dielectric substrate layer 46 utilizing a conventional deposition process including, but not limited to: CVD, PECVD, sputtering, ALD, chemical solution deposition or plating, or a combination of processes. After deposition, a conventional planarization process such as, for example, chemical mechanical polishing (CMP) or eletro-chemical mechanical polishing (eCMP) can be used to provide a structure in which the barrier layer 51 and the conductive feature 50 each have an upper surface that is substantially coplanar with the upper surface of the dielectric substrate layer 46. After forming the conductive feature, capping layer 42 may be formed using a conventional deposition process such as, for example, CVD, PECVD, chemical solution deposition, or evaporation. The capping layer 42 may comprise any suitable dielectric material such as, for example, SiC, $Si_4NH_3$, $SiO_2$, a carbon doped oxide, a nitrogen and hydrogen doped silicon carbide SiC(N,H) or multilayers thereof. The thickness of the capping layer 42 may vary depending on the technique used to form the same as well as the material make-up of the layer. Next, the active dielectric layer 38 is formed. The active dielectric layer 38 may comprise the same or different dielectric material as dielectric substrate 46. The prior description is illustrative of a single damascene formation. It is understood that the structure, i.e., the feature 50, is actively connected to layers and/or devices below in the structure 10. It is also typical to use a dual-damascene structure may also be used in the aforementioned process.

The dielectric hardmask layer 34 positioned over the active dielectric layer 38 may include an oxide, nitride, oxynitride or any combination including multilayers thereof. Typically, the hardmask material is an oxide such as $SiO_2$ or a nitride such as $Si_3N_4$. The blanket hardmask material is formed utilizing a conventional deposition process such as, for example, CVD, PECVD, chemical solution deposition or evaporation. The thickness of the as-deposited hardmask material may vary depending upon the type of hardmask material formed, the number of layers that make up the hardmask material and the deposition technique used in forming the same. Typically, the as-deposited hardmask material has a thickness from about 2 to about 100 nm, with a thickness from about 10 to about 60 nm being even more typical.

The photoresist layer 14 may be formed using a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. A lithographic step provides a patterned photoresist atop the Si-ARC layer 18 as shown in FIG. 1, which defines the width of the features 12.

The present disclosure addresses uncontrolled surface modification of a metal hardmask such as the TiN hardmask 30 by adding a protective layer or capping hardmask layer embodied as capping film 26 (which may also be referred to as a sacrificial film or layer, sacrificial capping film, or capping layer), as shown in FIG. 1, which protects a metal hardmask 34 during rework steps. The capping film 26, which may be a sacrificial layer or film, can be etched away after its application during a subsequent process. The capping film 26 may be inserted between films, as shown in FIG. 1, the capping film 26 is between layers 30 and 22, i.e., deposited on top of the TiN film 30. The capping film 26 can be any dielectric film and may comprise an oxide, nitride, and/or doped oxide or nitride film, such as silicon oxide or nitride, that is reactive to standard dielectric plasma etch chemistries, e.g., $CF_4$, $CHF_3$, $CH_2F_2$, $C_4F_8$, HBr, Chlorine for potentially removing the capping film 26 as a sacrificial film, or sacrificial capping film or layer.

The organic planarization layer 22 may be formed using an organic material. Typical organic layers which may be used are positive photoresist or polyimide. If photoresist is used it can be spin coated similar to a conventional photolithography step in integrated circuit manufacturing. Alternatively, an application may choose to use an inorganic planarization layer rather than an organic planarization layer such as spun glasses, for example, emulsified doped silicon 65 dioxide. The anti-reflective film layer 18 is an antireflective layer for suppressing unintended light reflection during photolithography. Exemplary materials for an antireflective layer include metal silicon nitrides, or a polymer film. The anti-reflective layer can be formed, depending on materials, for example, using sputter deposition, chemical vapor deposition, or spin coating.

The metallic layer, such as the metal hardmask layer 30 may be formed utilizing any conventional deposition process including, for example, CVD, PECVD, chemical solution deposition, evaporation, metalorgano deposition, ALD, sputtering, PVP or plating (electroless or electro). The thickness of the metallic layers may vary depending on the exact metallic interfacial material used as well as the deposition technique that was used in forming the same. Typically, the metallic layer 30 has a thickness from about 2 to about 100 nm, with a thickness from about 10 to about 60 nm being even more typical. The metallic layer 30 may be comprised of a metallic barrier material such as, for example, Co, TaN, Ta, Ti, TiN, Ru, Ir, Au, Rh, Pt, Pd or Ag. Alloys of such materials are also contemplated.

The capping film 26 may be a dielectric sacrificial film (as discussed above) and may be formed using chemical vapor deposition (CVD). Alternative variations of the CVD processes include, but are not limited to, Atmospheric Pressure CVD (APCVD), Low Pressure CVD (LPCVD) and Plasma Enhanced CVD (PECVD), Metal-Organic CVD (MOCVD) and others. In addition to chemical vapor deposition (CVD), a dielectric layer may also be formed using spinning from solution, spraying from solution, and evaporation. In an embodiment of the disclosure, the sacrificial film 26 may be deposited by a plasma-enhanced chemical vapor deposition (PECVD) process on top of film 30 without affecting integration. In one example, capping film 26 thickness may range from 5-100 nm, and may be selected based on the dielectric etch plasma chemistry. For example, capping film 26 thickness can be defined such that capping film 26 is fully removed during a latter stage of processing including a trench pattern in the active dielectric layer 38. In this case, capping film 26 is considered a sacrificial capping film.

During the integration reactive ion etching (RIE) process, the capping film 26 initially protects the metal hardmask 34 and is subsequently removed during finishing stages of the integrated RIE process. The capping film 26 provides protection while adding a minimal modification to established metal hardmask RIE processes. One embodiment of a sacrificial capping film or layer is a dielectric film that during deposition does not adversely modify the metal Hardmask, and assists in the retention of the metal hardmask during the metal hardmask pattern transfer etch processing, but is similar enough in RIE etch rate to be removed during the dielectric RIE process step.

The capping film 26 may be etched away during a dual damascene etch. An additional step in the semiconductor processing is unnecessary, and thus, the integration of the capping film 26 is transparent in the processing, but provides a protective nature during lithography rework processes. Lithography rework uses a dry ash process with oxidizing or reducing chemistries like oxygen ($O_2$, $CO_2$), ammonia ($NH_3$), and/or a mixture of nitrogen and hydrogen ($N_2/H_2$). The capping film 26 provides the advantage of avoiding undesirable affects of a typical rework process by protecting the metal hardmask (layer 30) during the rework process. Further, the capping film 26 provides this function because it is resistant to physical thickness loss during the rework process. Therefore, avoiding an increase in the non-uniformity of critical features across a wafer diameter. Furthermore, the capping film 26 is designed such that during a rework process any chemical modification of the capping film 26 is of a minimal nature. This is such that the subsequent etch behavior of the capping film 26 during the patterning process is insignificantly changed from that of the performance of the capping film 26 that was not subjected to a rework process. Further, subsequent rework passes are enabled while minimizing any adverse affects associated with rework interaction with the metal hardmask mask because the hardmask layer 30, protected by the capping layer 26, is not damaged.

As discussed above, metal hardmask integration process techniques can sputter an exposed metal hardmask during dielectric etch steps of dual damascene etch RIE processing and/or during rework processing. The sacrificial layer 26 according to the present disclosure provides protection of the capped layer, i.e., layer 30, from the above sputtering processes. When a protective layer is not present, the gases used in the above processing physically impact (sputter) the metal hardmask potentially resulting in defects, as well as eroding the final physical profile during the RIE profiling process. Additionally, these gasses may also combine with the exposed surface of the metal Hardmask and modify the surface chemistry of this metal Hardmask. An example of this is that the metal Hardmask becomes less resistant to oxidation during exposure to ambient air. Ambient air exposure typically occurs during routine transfer of wafer substrates between processing tools. Thereby, the present disclosure resolves the problems above by enhancing control of the RIE processes to meet required parameters of the pattern transfer process. For example, the use of the capping film 26 over the layer 30 results in discouraging TiN erosion of layer 30, that occurs when the protective layer is not utilized, and thereby discourages a widening of the top trench CD. One of the advantages to overall integration yield from of the above result is a possible reduction in electrical short circuits, decreased electrical performance variation, and increased reliability of the electrical characteristics in the semiconductor.

Additionally, the capping film 26 passivates the TiN layer 30 to prevent moisture and native oxide formation. For example the capping film 26 protects the surface of the metal hardmask from modification during the HMO transfer process, such that the surface of the metal hardmask is protected from oxidation during subsequent exposure to ambient air. This eliminates queue-time effects between TiN deposition, lithography and subsequent etch processes. The thickness of the sacrificial film 26 may range from 2-60 nm (nano Meters), lithography conditions are minimally impacted, and a sacrificial layer at the above thickness can be removed at a damascene etch.

Figure 2:
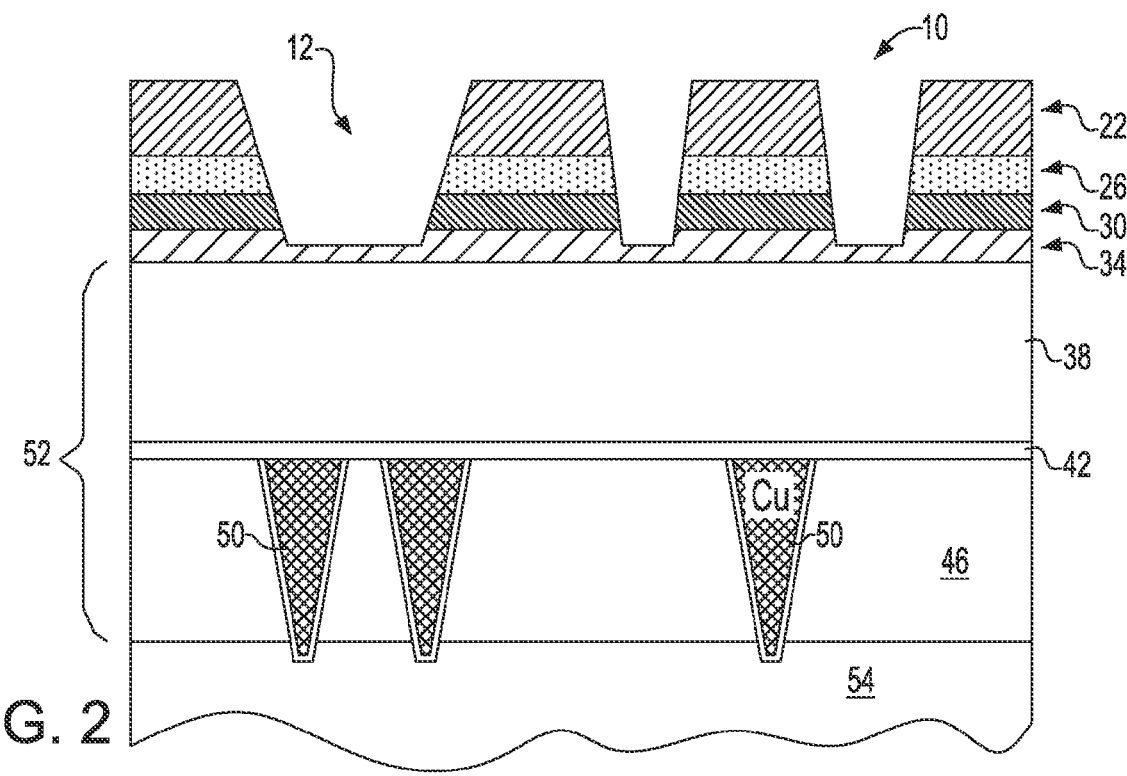
FIG. 2 is a cross sectional side elevational view of the structure shown in FIG. 1 after an etching process.

Referring to FIG. 2, the resist film 14 and the Si-Arc film 18 are etched away and trenches 12 are extended through the layers 22, 26, 30 and into the dielectric hardmask film 34. More specifically, after patterning the photoresist 14, the feature pattern is transferred into the hard mask material of layer 34, and then subsequently into the dielectric material of the active dielectric layer 38 utilizing one or more etching process. After the desired features are transferred into the hard mask to create a patterned hard mask, a conventional stripping process may be used to strip any remaining patterned lithograghy layers. Alternatively, any remaining patterned photoresist may be stripped during or after the feature pattern is transferred into the dielectric material 38. The etching used in transferring the feature pattern may comprise a dry etching process, a wet chemical etching process or a combination thereof. The term "dry etching" is used herein to denote an etching technique such as reactive-ion etching, ion beam etching, plasma etching or laser ablation.

Figure 3:
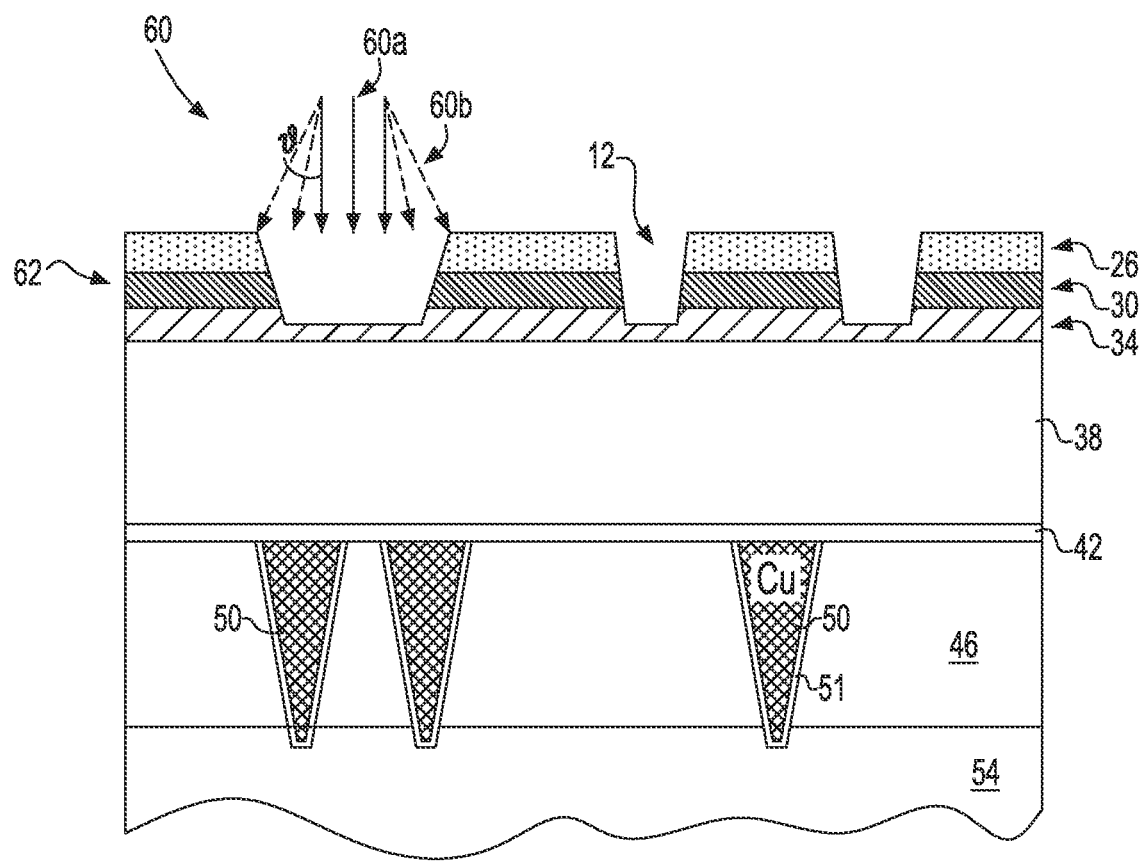
FIG. 3 is a cross sectional side elevational view of the structure shown in FIG. 2 during another etching process.

Referring to FIG. 3, the films 14-22 in FIG. 1 have been etched away and are no longer present. Capping film 26 is on top of film 30. Although it is desired to have a columnated beam of ions to impinge the surface of the substrate, it is well known that scattering effects occur and typically create a broad range of angular impact. As a dielectric etch process begins, ions 60 bombard the defined pattern with vertical 60a, and lateral components 60b, as shown by arrows in FIG. 3. It is further known in plasma science, that reducing chamber pressure and gas flow minimizes large angular bombardment. However, the lateral etch component cannot be eliminated, hence, polymeric chemistries are used which result in tapered trench profiles. One advantage of the use of sacrificial film 26 is the lateral etch component can be reduced, and the pattern transfer suffers less tapered profile which results in a smaller top CD. Furthermore, the capping film 26 and etch chemistries and process conditions can be selected such that these effects can be further minimized.

More specifically, referring to FIG. 3, in an instance of a damascene etch, ions 60 can bombard the trench profile 62 at all angles, this may occur at highly anisotropic plasma conditions. Lithography and plasma etch define the pitch and pattern fidelity of the trench profile 62. Without the capping film 26, the TiN hardmask 30 erosion can lead to wider top CD and round profiles of the trench profile at the TiN hardmask 30. With the capping film 26 according to the present disclosure, the TiN hardmask 30 profile can be preserved until the end of the processing of the structure 10, resulting in a smaller CD (structure 12) of the trench profile at the TiN hardmask 30. Thereby, an advantage of the present disclosure is that the resulting smaller CD enables extension of forming smaller features based on technology scaling. The capping film 26 has an additional advantage in that it decreases the need for shrink processing while sustaining minimum CD. The shrink processing is a method to reduce lithography defined feature size through the use of subsequent processing to create a resultant smaller features size than was defined by the lithography process.

It is known that TiN film hardmask stress can induced the phenomenon of line wiggling after the initial trench definition of hardmask open step, which adversely affects the fidelity of pattern transfer. A further advantage of the present disclosure is that the stress from the capping film 26 can counter balance the TiN's stress and reduce the tendency to wiggle or distort the line during and after RIE processing. Moreover, TiN reacts with fluorocarbon plasma to generate oxide growth on wafers. Another objective of capping film 26 is that any oxide growth and defectivity induced by the hard mask open RIE are more homogeneous with the chemistry and structure of film 26 and as such are readily etched during the trench formation of film 38. Thereby, the embodiments of the present disclosure discourage and minimize the impact of the described adverse effects.

Capping film 26 is compatible with any organic film required over the capping film 26, for example, film 22. For example, for TFHM integration, an etch step may extend to and stop on film 34. No new plasma chemistry is required to etch the capping film 26, for example, standard plasma chemistry may be used to etch films 14-30, and also may be used to etch the capping film 26. As shown in FIGS. 1-3, a first etch step etches away films 14 and 18. Film 22 is etched clear, resulting in the film stack shown in FIG. 3. Thus, capping film 26 acts to shield film 30 at the dielectric etch steps. Further, as plasma attacks capping film 26 vertically and laterally, film 30, which defines the pattern CD, is protected. The pattern transfer of features, that is trenches 12 into active dielectric layer 38, is completed and shown in FIG. 4, and capping layer 26 has been removed as shown in FIG. 4.

Figure 4:
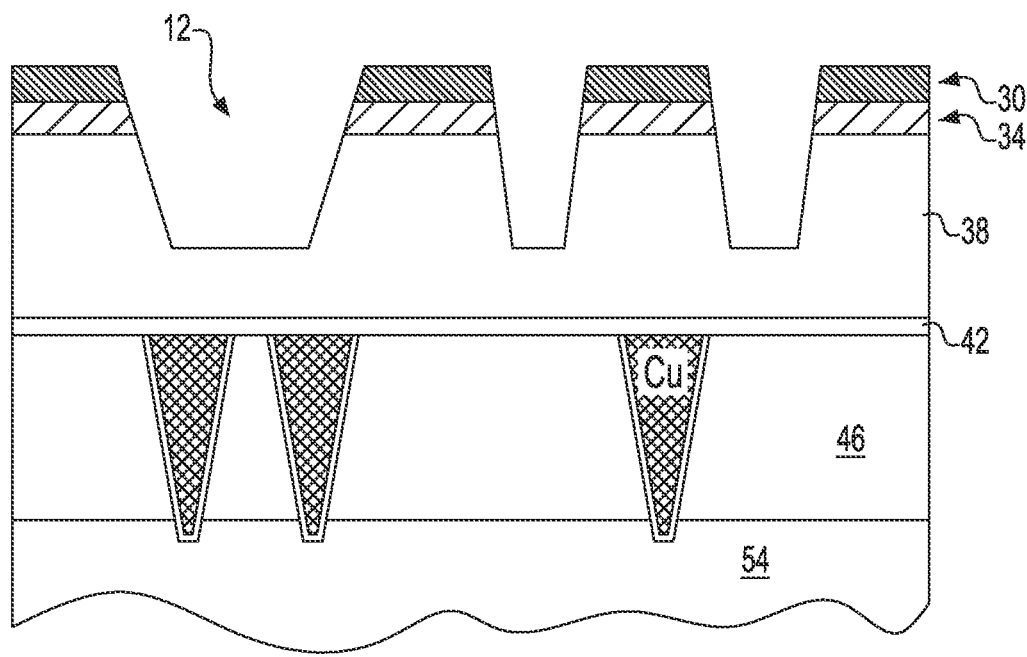
FIG. 4 is a cross sectional side elevational view of the structure after the etching process shown in FIG. 3.

Thereby, as shown in FIG. 4, the capping film 26 enables the final top CD in film 30 of the trenches 12 to be smaller than without using capping film 26. Other benefits of the capping film 26 in a metal hardmask integration approach include, enhanced RIE process window with sacrificial cap and scalable to smaller pitches, reduced top CD at both nested and wide lines, tunable mask thickness to enhance etch depth without high aspect ratio at metal liner. A fundamental advantage of the capping film 26 is that it can protect the metal hardmask film 30 without significantly increasing the thickness of the bilayer structure 26 and 30. This improves the control of the CD avoiding the introduction of higher aspect ratio features which contribute to the difficulty to metalize the line features. Thus, as the capping film 26 is etched away, the CD control is realized without changing the aspect ratio defined in a technology node.

While the present disclosure has been particularly shown and described with respect to preferred embodiments thereof, it will be understood by those skilled in the art that changes in forms and details may be made without departing from the spirit and scope of the present application. It is therefore intended that the present disclosure not be limited to the exact forms and details described and illustrated herein, but falls within the scope of the appended claims.

What is claimed is:

1. A method for forming a trench pattern in a structure, comprising:
    forming a dielectric hardmask layer over a dielectric substrate, said dielectric substrate comprising a stack of, from bottom to top, a patterned dielectric substrate layer and a dielectric layer;
    forming a metal hardmask layer over the dielectric hardmask layer;

forming a capping hardmask layer over the metal hardmask layer, wherein a stress in the capping hardmask layer is configured to counter balance a stress in the metal hardmask layer;

forming at least one organic layer over the capping hardmask layer;

forming an initial trench pattern through the at least one organic layer, the capping hardmask layer, and the metal hardmask layer and into the dielectric hardmask layer;

removing the at least one organic layer; and extending the initial trench pattern into the dielectric layer of the dielectric substrate to form a trench pattern, wherein the capping hardmask layer is present during an initial stage of said forming the trench pattern to protect the metal hardmask layer from erosion.

2. The method of claim 1, further comprising:

performing an ion bombardment on the initial trench pattern for transferring the initial trench pattern into the dielectric layer of the dielectric substrate, wherein during said ion bombardment a lateral etch component of the ions is reduced by the capping hardmask layer such that a critical dimension of the trench pattern that is defined by the metal hardmask layer is preserved.

3. The method of claim 1, wherein the step of forming a metal hardmask layer includes forming a TiN hardmask layer.

4. The method of claim 1, wherein the step of forming at least one organic layer includes forming a photoresist layer, and the method further comprises:

forming said trench pattern in the photoresist layer.

5. The method of claim 1, wherein the step of forming said capping hardmask layer includes forming a dielectric hardmask capping layer.

6. The method of claim 1, further comprising:

removing the capping hardmask layer during a later stage of said forming said trench pattern.

7. The method of claim 6, wherein the step of removing the capping hardmask layer includes etching.

8. The method of claim 1, further comprising, and prior to said forming said initial trench pattern through the at least one organic layer, the capping hardmask layer, and the metal hardmask layer and into the dielectric hardmask layer:

forming a doped layer in the dielectric substrate;

forming an organic planarization layer (OPL) over the capping hardmask layer;

forming an anti reflective coating (ARC) layer over the OPL layer; and forming a resist layer over the ARC layer.

9. The method of claim 8, further comprising:

forming said trench pattern through the resist layer, the ARC layer, the OPL layer, the capping hardmask layer, the metal hardmask layer, the dielectric hardmask layer, and into the dielectric layer of the dielectric substrate; and removing the resist layer, the ARC layer, the OPL layer, and the capping hardmask layer.

10. The method of claim 8, wherein the doped layer includes nitrogen-doped silicon carbide (Si—N—C—H) and Tetra-ethylorthosilicate (TEOS).

11. The method of claim 8, wherein the step of forming an ARC layer includes forming a silicon ARC layer.

* * * * *